United States Patent
Ben Artsi (10) Patent No.: US 11,789,067 B1
(45) Date of Patent: Oct. 17, 2023

(54) PHYSICAL LAYER PARAMETER COMPLIANCE IN HIGH SPEED COMMUNICATION NETWORKS

(71) Applicant: Marvell Israel (M.I.S.L) Ltd., Yokneam (IL)

(72) Inventor: Liav Ben Artsi, Nahariya (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 30 days.

(21) Appl. No.: 17/170,622

(22) Filed: Feb. 8, 2021

Related U.S. Application Data (60) Provisional application No. 62/971,623, filed on Feb. 7, 2020.

(51) Int. Cl.
*H01L 21/67* (2006.01)
*G01R 31/28* (2006.01)

(52) U.S. Cl.
CPC .... *G01R 31/2896* (2013.01); *H01L 21/67288* (2013.01)

(58) Field of Classification Search
CPC ............ G01R 31/2896; G01R 31/2851; G01R 31/317; G01R 31/26; G01R 31/28; H01L 21/67288; H01L 22/00; H01L 21/67
See application file for complete search history.

(56) References Cited

U.S. PATENT DOCUMENTS

| | | | | |
|---|---|---|---|---|
| 2016/0163609 A1* | 6/2016 | Rahman | ............... | H01L 25/0652 257/48 |
| 2016/0169973 A1* | 6/2016 | Leclerc | ............... | G01R 31/2856 702/119 |

FOREIGN PATENT DOCUMENTS

| | | | | |
|---|---|---|---|---|
| CN | 106154201 A | * | 11/2016 | |
| CN | 109406988 A | * | 3/2019 | ......... G01R 31/2851 |

(Continued)

OTHER PUBLICATIONS

IEEE Std 802.3-2002, "IEEE Standard for Information technology—Telecommunications and information exchange between systems—Local and metropolitan area networks—Specific requirements, Part 3: Carrier sense multiple access with collision detection (CSMA/CD) access method and physical layer specifications," *The Institute of Electrical and Electronics Engineers, Inc.*, 379 pages (Mar. 8, 2002).

(Continued)

*Primary Examiner* — Natalie Huls
*Assistant Examiner* — James I Burris (57) ABSTRACT

An integrated circuit (IC) is manufactured and is mounted in an IC package. A processor of a measurement system determines a reference value of a physical layer (PHY) parameter at a second test point on a test fixture based on one or more model values, specified by an Ethernet communication standard, corresponding to a first test point on the test fixture corresponding to a contact on the IC package and one or more measured test fixture parameters characterizing a channel connecting the first test point to the second test point on the test fixture. The processor then determines whether the PHY parameter at the first test point on the IC package complies with the Ethernet communication standard based on i) the reference value of the PHY parameter and ii) a measured value of the PHY parameter obtained from a measurement of the PHY parameter at the second test point.

22 Claims, 4 Drawing Sheets

(56) References Cited

FOREIGN PATENT DOCUMENTS

| KR | 2016116942 A | * | 10/2016 | ......... G01R 31/2822 |
| WO | WO-2007121330 A1 | * | 10/2007 | ..... G01R 31/318558 |

OTHER PUBLICATIONS

IEEE Std 802.3-2005, "IEEE Standard for Information technology—Telecommunications and information exchange between systems—Local and metropolitan area networks—Specific requirements, Part 3: Carrier sense multiple access with collision detection (CSMA/CD) access method and physical layer specifications," *The Institute of Electrical and Electronics Engineers, Inc.*, Sections 1-5, 2695 pages (Dec. 9, 2005).

IEEE Draft P802.3ae/D5.0 Supplement to Carrier Sense Multiple Access with Collision Detection (CSMA/CD) Access Method & Physical Layer Specifications—Media Access Control (MAC) Parameters, Physical Layer, and Management Parameters for 10 GB/s Operation *The Institute of Electrical and Electronics Engineers, Inc.*, 540 pages (May 1, 2002).

Chen, "Home Network Basis: Transmission Environments and Wired/Wireless Protocols," Prentice Hall, 26 pages (2006).

IEEE Std. 802.3bp™/D1.5, "Draft Standard for Ethernet Amendment: Physical Layer Specifications and Management Parameters for 1Gb/s Operation over a Single Twisted Pair Copper Cable," *The Institute of Electrical and Electronics Engineers, Inc.*, 202 pages (Jun. 14, 2015).

IEEE Std. 802.3bp™—2016, "IEEE Standard for Ethernet—Amendment 4: Physical Layer Specifications and Management Parameters for 1Gb/s Operation over a Single Twisted Pair Copper Cable," *The Institute of Electrical and Electronics Engineers, Inc.*, 211 pages (Jun. 30, 2016).

IEEE Std. P802.3ck™/D1.4, "Draft Standard for Ethernet Amendment: Physical Layer Specifications and Management Parameters for 100 GB/s, 200 GB/s, and 400 GB/s Electrical Interfaces Based on 100 GB/s Signaling," 291 pages (Dec. 10, 2020).

IEEE Std. 802.3cd™—2018, "Amendment 3: Media Access Control Parameters for 50 GB/s and Physical Layers and Management Parameters for 50 GB/s, 100 GB/s, and 200 GB/s Operation," Amendment to IEEE Std. 802.3™—2018 as amended by IEEE Std. 802.cb™—2018 and IEEE Std. 802.3bt™—2018, 401 pages (Dec. 5, 2018).

Mellitz et al., "Practical Device Test Fixtures for 100G Kr . . . Or Not and the Impact on Erl and PmaxNf (ref: commen 19, 20, 21, 25)," IEEE 802.3 100 Gb/s, 200 Gbls, and 400 Gb/s Electrical Interfaces Task Force, 23 pp., Jan. 2020.

* cited by examiner

PHYSICAL LAYER PARAMETER COMPLIANCE IN HIGH SPEED COMMUNICATION NETWORKS

CROSS REFERENCES TO RELATED APPLICATIONS

This application claims the benefit of U.S. Provisional Patent Application No. 62/971,623, entitled "Measuring Transmitter Compliance Parameters at a Variable TP0a," filed on Feb. 7, 2020, which is hereby incorporated herein by reference in its entirety.

FIELD OF TECHNOLOGY

The present disclosure relates generally to communication networks, and more particularly to physical layer parameter compliancy for high speed communication networks.

BACKGROUND

Manufacturing of network communication devices, such as network interface communication packaged integrated circuit devices, typically includes performing physical layer parameter measurements to ensure that physical layer (PHY) parameters of the network communication device are compliant with a communication standard. Because it is typically difficult to directly access an input/output contact on an IC package for measurement of a PHY parameter at the I/O of the IC package, test fixtures are often utilized to bring PHY signals to or from I/O contacts on the IC package out to measurement points on a test fixture, where the signals can be more easily accessed and measured. However, when a test fixture is used, it is important to take effects of the test fixture into account to determine PHY parameter compliance of the communication device. To facilitate determination of compliance based on measurements performed at a test point on a test fixture, some current communication standards specify the PHY parameters at the test point on the test fixture. Further, in order to ensure that the test point on the test fixture sufficiently closely reflects compliance of the communication device at a corresponding I/O contact of the IC package, the communication standard typically specifies strict and narrow range requirements that must be met by the test fixture. For example, the communication standard may specify that the test fixture has to introduce a loss that is sufficiently small and is within a narrow range specified by the communication standard. Such strict requirements for the test fixture make it difficult not only to design and manufacture test fixtures, but have also rendered impractical or even impossible to manufacture some test fixtures, particularly test fixtures for measuring compliance of communication devices that are intended to support transmission at relatively high transmission rates (e.g., greater than 25 GHz) and/or transmission over multiple lanes of a communication link.

SUMMARY

In an embodiment, a method for manufacturing a communication device that is compliant with an Ethernet communication standard includes: fabricating an integrated circuit (IC) configured to implement one or more physical layer (PHY) functions of the communication device; mounting the IC in an IC package; receiving, at one or more processors of a measurement system, one or more measured test fixture parameters characterizing a channel connecting a first test point on a test fixture to a second test point on the test fixture, the first test point on the test fixture corresponding to a contact on the IC package; determining, by the one or more processors of the measurement system, a reference value of a physical layer (PHY) parameter at the second test point on the test fixture, including determining the reference value based on i) one or more model values specified by the Ethernet communication standard, the one or more model values corresponding to the first test point on the test fixture, and ii) the one or more measured test fixture parameters characterizing the channel connecting the first test point on the test fixture to the second test point on the test fixture; and determining, by the one or more processors of the measurement system, whether the PHY parameter at the first test point on the IC package complies with the Ethernet communication standard based on i) the reference value of the PHY parameter at the second test point on the test fixture, and ii) a measured value of the PHY parameter, the measured value obtained from a measurement of the PHY parameter at the second test point on the test fixture when the IC package is mounted on the test fixture.

In another embodiment, a measurement system for determining compliance of an integrated circuit (IC) mounted in an IC package comprises a test fixture comprising a channel connecting a first test point on the test fixture to a second test point on the test fixture, the first test point on the test fixture corresponding to a contact on the IC package. The measurement system also comprises one or more processors, and a memory storing computer-readable instructions that, when executed by the one or more processors, cause the one or more processors to: receive one or more measured test fixture parameters characterizing the channel on the test fixture; determine a reference value of a physical layer (PHY) parameter at the second test point on the test fixture, including determining the reference value based on i) one or more model values specified by the Ethernet communication standard, the one or more model values corresponding to the first test point on the test fixture, and ii) the one or more measured test fixture parameters characterizing the channel connecting the first test point on the test fixture to the second test point on the test fixture; and determine whether the PHY parameter of the IC complies with the Ethernet communication standard based on i) the reference value of the PHY parameter at the second test point on the test fixture and ii) a measured value of the PHY parameter of the IC, the measured value obtained from a measurement of the PHY parameter performed at the second test point on the test fixture when the IC package is mounted on the test fixture.

In yet another embodiment, a non-transitory computer-readable medium, or media, storing instructions that, when executed by one or more processors, cause the one or more processors to: receive one or more measured test fixture parameters characterizing a channel connecting a first test point on the test fixture to a second test point on a test fixture, the first test point on the test fixture corresponding to a contact on an integrated circuit IC package; determine a reference value for a physical layer (PHY) parameter of an IC mounted in the IC package, the reference value corresponding to the second test point on the test fixture, including determining the reference value based on i) one or more model values specified by the Ethernet communication standard, the one or more model values corresponding to the first test point on the test fixture, and ii) the one or more measured test fixture parameters characterizing the channel connecting the first test point on the test fixture to the second test point on the test fixture; and determine whether the PHY parameter of the IC complies with the Ethernet communication standard based on i) the reference value of the PHY parameter at the second test point on the test fixture, and ii) a measured value of the PHY parameter of the IC, the measured value obtained from a measurement of the PHY parameter performed at the second test point on the test fixture when the IC package is mounted on the test fixture.

DETAILED DESCRIPTION

In embodiments described below, PHY parameter compliance of a communication device, that comprises an integrated circuit (IC) mounted in an IC package, with a communication standard is determined based on i) a reference value of the PHY parameter determined based on a) one or more model values specified by the communication standard, the one or more model values corresponding to a first test point on a test fixture, the first test point corresponding to a contact on the IC package when the IC package is mounted on the test fixture and b) one or more measured parameters characterizing a channel that connects the first point on the test fixture to a second test point on the test fixture, and ii) a value of the PHY parameter obtained based on a measurement performed at the second test point on the test fixture. Determining compliance of the PHY parameter of the communication device based on a measurement performed at the second test point on the test fixture and a reference model corresponding to the first test point on the test fixture relaxes test fixture requirements as compared to systems in which compliance of a PHY parameter of the communication device is determined based on a compliance value specified at the measurement test point on the test fixture, in at least some embodiments. As explained in more detail below, such relaxed test fixture requirements facilitate design and manufacture of a test fixture for compliance measurements of a communication device configured to operate with relatively high transmission speeds (e.g., greater than or equal to 26 GHz transmission speeds on each lane of a communication link) and/or configured to transmit signals over relatively high numbers of lanes (e.g., four or more lanes) in a communication link, in various embodiments. As also explained in more detail below, such relaxed test fixture requirements also allow greater flexibility for placement of PHY input/output (I/O) contacts on the IC package of the communication device, for example by not restricting placement of the PHY I/O contacts on an edge (e.g., an outer row or column) of contacts on the IC package, in at least some embodiments.

Figure 1:
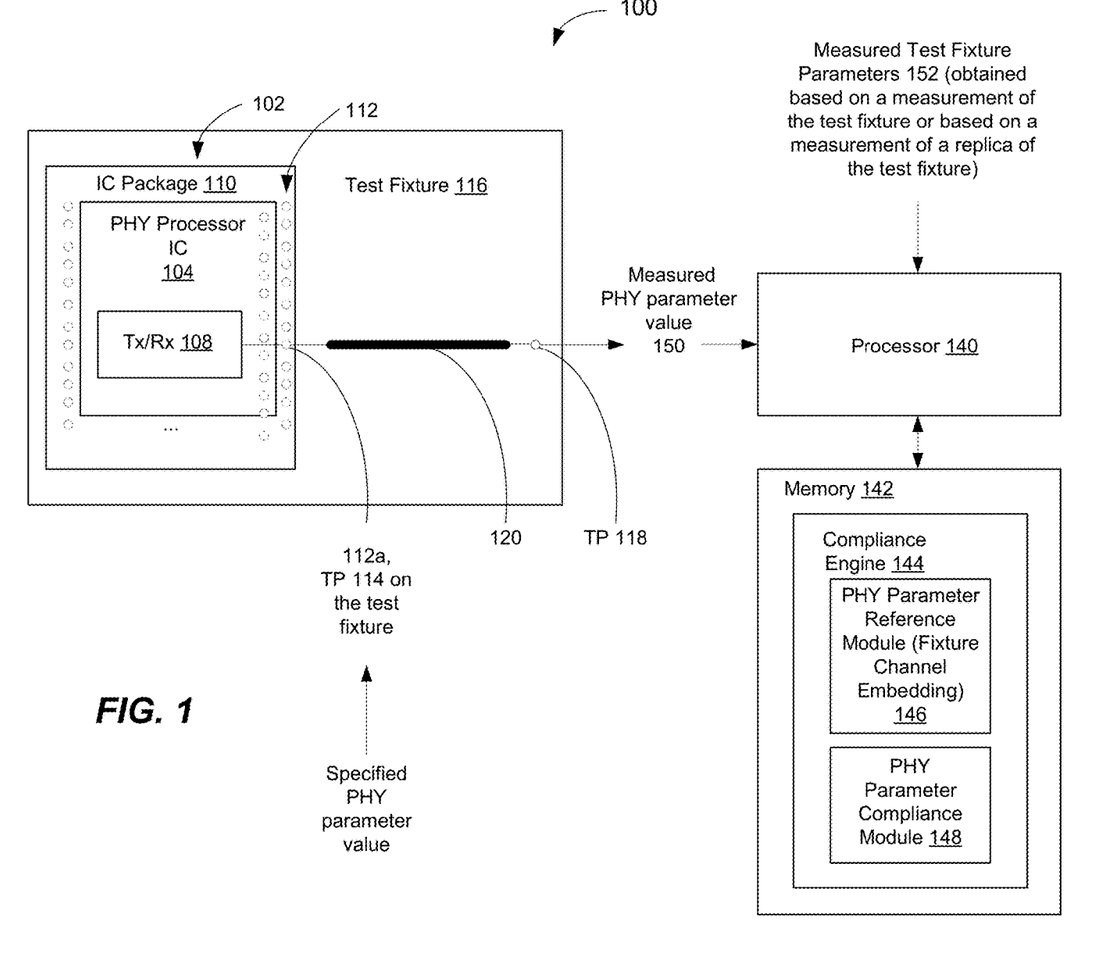
FIG. 1 is a block diagram of an example measurement system for determining compliance of an Ethernet integrated circuit (IC), according to an embodiment.

FIG. 1 is a block diagram of an example measurement system 100 for determining compliance of a communication device 102, according to an embodiment. The communication device 102 is an Ethernet communication device configured to operate according to, and to comply with, an Ethernet communication standard. For example, in an embodiment, the communication device 102 is configured to operate according to, and to comply with, the IEEE 802.3ck communication standard. In another embodiment, the communication device 102 is configured to operate according to, and to comply with, a suitable Ethernet communication standard different from the IEEE 802.3ck communication standard or a communication standard other than an Ethernet communication standard.

In an embodiment, the communication device 102 includes at least one IC 104 configured to implement functions of a PHY processor (sometimes referred to herein as "PHY processor IC 104") of the communication device 102. The PHY processor IC 104 includes a transceiver 108 configured to transmit and receive signals over a communication link. For example, the transceiver 108 is configured to transmit and receive signals over a backplane link (e.g., a trace), a twisted pair link, such as a twisted pair link comprising a single pair of wires or a twisted pair link comprising multiple (e.g., 2, 4, etc.) twisted pairs of wires), a fiber optic link or another suitable type of communication link, in various embodiments. In some embodiments, the communication device 102 also includes one or more additional processors, such as one or more media access control (MAC) processors (not shown in FIG. 1) implemented on the one or more ICs and coupled to the PHY processor IC 104. In another embodiment, the communication device 102 omits one or more MAC processors. For example, the one or more MAC processors are external to the communication device 102, in an embodiment.

Manufacturing of the communication device 102 includes fabricating the PHY processor IC 104 using a suitable IC fabrication process, in an embodiment. For example, fabricating the PHY processor IC 104 includes forming various PHY processor circuit components on a surface of crystal die or wafer, such as a silicon wafer, in an embodiment. Manufacturing of the communication device 102 also includes mounting the fabricated PHY processor IC 104 (e.g., bonding the PHY processor IC 104 or wafer into) an IC package 110, according to an embodiment. The IC package 110 is a ball-grid array (BGA) package, such as fine-pitch ball-grid array (FBGA) or a low-profile ball-grid array (LBGA) package, for example, in an embodiment. The IC package 110 is another suitable type of package, such as a flat no-leads type of package, in another embodiment. The IC package 110 comprises a plurality of input/output (I/O) contacts 112, such as a plurality of balls or pins that are suitably arranged on one or more sides (e.g., the bottom side) of the IC package 110. The I/O contacts 112 include at least one transmitter (Tx) contact 112a bonded to an output of the transceiver 108, in an embodiment. Although only a single Tx contact 112a is illustrated in FIG. 1, the I/O contacts 112 include a plurality of Tx contact 112a bonded to respective outputs of the transceiver 108, in some embodiments. For example, the I/O contacts 112 include respective Tx contacts 112a bonded to respective ones of a pair of differential outputs of the transceiver 108 for outputting signals for transmission over a twisted pair communication link and/or for bonded to respective outputs of the transceiver 108 for outputting respective signals for transmission on respective lanes of a multi-lane communication link, etc., in some embodiments. The I/O contacts 112 also include other contacts, such as contacts bonded to receive inputs of the transceiver 108 for receiving signals over the communication link, in some embodiments.

In an embodiment, the measurement system 100 includes a test fixture 116 for measuring PHY parameters of the communication device 102 for determination or validation of compliance of the PHY parameters of the communication device 102 with the communication standard. The test fixture 116 is a printed circuit board (PCB) or another suitable structure configured to connect (e.g., fan out) i) one or more test points 114 corresponding to one or more I/O contacts 112 (e.g., the TX contact 112*a*) on the IC package 110 to ii) one or more test points 118 on the test fixture 116. In an embodiment, the test fixture 116 comprises one or more channels (e.g., suitably PCB traces or cables) 120 for connecting the one or more test points 114 corresponding to the one or more I/O contacts 112 on the IC package 110 to respective one or more test points 118 on the test fixture 116. In an embodiment, a test point 114 on the test fixture 116 is provided for coupling directly with an I/O contact 112 on the IC package 110, whereas the corresponding test point 118 is used for connecting measurement equipment to the test fixture 116 to obtain PHY parameter measurements of the communication device 102 using the test fixture 116. The PHY parameters of the communication device 102 that are measured at the one or more test points 118 of the test fixture 116, with the communication device 102 mounted on or otherwise connected to the test fixture 116, include one or more of i) return loss at a transmitter output of the communication device 102, ii) effective return loss (ERL) at a transmitter output of the communication device 102, iii) a steady state voltage at the transmitter output of the communication device 102, and iv) a peak voltage at the transmitter output of the communication device 102, in an embodiment. In another embodiment, other suitable PHY parameters of the communication device 102 are, additionally or alternatively, measured at the one or more test points 118 of the test fixture 116. Although the test fixture 116 is illustrated in FIG. 1 as having a single test point 118 and a single channel 120, for connecting a single test point 114 corresponding to a single I/O contact 112 on the IC package 110 to a single test point 118 on the test fixture 116, the test fixture 116 includes multiple test points 118 and multiple corresponding channels 120, for connecting multiple test point 114 corresponding to multiple I/O contacts 112 on the IC package 110 to multiple test points 118 on the test fixture 116, in some embodiments.

In an embodiment, compliance of the PHY parameters of the communication device 102 with the communication standard is determined based on measurements performed at the one or more test points 118 on the test fixture 116. In prior test systems in which device compliance of PHY parameters of a communication device with a communication standard was determined based on measurements performed at a test point on a test fixture, compliance of the PHY parameters of the communication device was determined based on compliance values for the PHY parameters specified at the test point on the test fixture by the communication standard. Further, in order to ensure that the test point on the test fixture sufficiently closely reflected compliance at a test point corresponding to an I/O contact on an IC package of the communication device, the test fixture used for measurement of compliance of the communication device had to meet strict requirements specified by the communication standard. For example, the test fixture had to meet one or more of requirements such as a loss, a loss variance, and a return loss and/or effective return loss within a respective narrow range specified for the parameter by the communication standard. Thus, electrical distance between a test point corresponding to an I/O contact on an IC package of the communication device and a test point for obtaining PHY parameter measurements for determining compliance of the communication device was substantially fixed by the communication standard. Such strict requirements made it difficult or impossible to design and manufacture suitable test fixtures, particularly test fixtures for performing measurements with relatively high transmission speeds, such equal to or greater than greater than 26 GHz transmission speeds, corresponding to a 100 Gbps communication link. Moreover such strict test fixture requirements limited the design of ICs and/or IC packages of the communication device that could be tested with the test fixture, for example limiting placement of PHY I/O contacts on an outer row or column of I/Os on a ball grid array on the IC package.

In an embodiment, instead of determining compliance of a PHY parameter of the communication device 102 based on a compliance value specified at the test point 118 of the test fixture 116, the measurement system 100 is configured to determine compliance of the PHY parameter of the communication device 102 based on a specification of the PHY parameter at the test point 114 corresponding to the I/O contact 112*a* on the IC package 110 by mathematically embedding the channel 120 on the test fixture 116 into a reference model specified by the communication standard to arrive at a reference value for the PHY parameter at the test point 118 on the test fixture 116. Thus, electrical distance between the test point 114 corresponding to the I/O contact 112*a* on the IC package 110 of the communication device 102 and the test point 118 on the test fixture 116 is not fixed by the communication standard and can depend on design and implementation of the test fixture 116, in an embodiment. Determining compliance of the PHY parameter by mathematically embedding the channel 120 used for measurement of the PHY parameter on the test fixture 116 into a reference model specified by the communication standard relaxes test fixture requirements as compared to systems in which compliance of a PHY parameter is determined based on a compliance value for the PHY parameter specified at the test point of measurement on the test fixture, while still allowing PHY parameter compliance to be determined without de-embedding the channel of the test fixture from a measurement performed at the test point on the test fixture, in at least some embodiments. For example, the communication standard requires the test fixture to have an insertion loss in a range of insertion losses, the range being at least 4 dB, in an embodiment. As just an example, the communication standard requires insertion loss of the channel on the test fixture to be between 1.7 and 5 dB at around 26 GHz, or requires insertion loss of the channel on the test fixture to be less than 6 dB at around 26 GHz, in some embodiments. Such relaxed requirements for the test fixture 116 allow for the communication device 102 (e.g., the IC 104 and/or the IC package 110) to be designed and manufactured for operation with relatively higher speeds in a communication link and/or with a relatively larger number of lanes in the communication link as compared to communication devices that could be used with systems in which PHY parameter compliance is determined based on a compliance value specified at a fanned out test point on a test fixture imposing stricter requirements for the test fixture, in at least some embodiments. Such relaxed requirements for the test fixture 116 allow greater flexibility for the design of the PHY processor IC 104 and/or the IC package 110, such as placement of the I/O contacts 112 on the IC package 110, in at least some embodiments.

The measurement system 100 is illustrated in FIG. 1 as including a processor 140 coupled to computer readable memory 142 that stores computer readable instructions executable by processor 140, in an embodiment. The computer readable memory 142 is illustrated in FIG. 1 as storing computer readable instructions for implementing a compliance engine 144 that includes a PHY parameter reference calculation module 146 and the PHY parameter compliance module 148. The computer readable memory 140 includes volatile memory to store computer instructions, such as Random Access Memory (RAM), in an embodiment. Additionally or alternatively, the computer readable memory 142 includes persistent memory such as a hard disk, for example, in an embodiment. In an embodiment, the processor 140 and the memory 142 are included in an oscilloscope or other measurement equipment used for obtained measurements in the measurement system 100. In another embodiment, the processor 140 and the memory 142 are parts of a computing system separate from measurement equipment used for obtained measurements in the measurement system 100.

Although only a single processor 140 is illustrated in FIG. 1, the system 100 includes multiple processors 130 in some embodiments. Further, the compliance engine 144, the PHY parameter reference calculation module 146 and/or the PHY parameter compliance module 148 are implemented (e.g., in a specialized compliance measurement system) using hardware components, firmware components, software components, or any combination thereof, in some embodiments.

In an embodiment, the compliance engine 144 is configured to determine compliance of a PHY parameter of the communication device 102 with a communication standard based on i) a value of the PHY parameter 150 measured at the test point 118 with the communication device 102 mounted on, or otherwise connected to, the test fixture 116 and ii) a reference value of the PHY parameter determined based on a) one or more model values specified by the communication standard, the one or more model values for the test point 114 corresponding to the contact 112a on the IC package 110 and b) one or more test fixture parameters 152 characterizing the channel 120 that connects the test point 114 to the test point 118 on the test fixture 116, in an embodiment. In an embodiment, the one or more test fixture parameters 152 characterizing the channel 120 on the test fixture 116 comprise scattering parameters (S-parameters) or other suitable types of parameters that characterize the channel 120 on the test fixture 116. The one or more test fixture parameters 152 are obtained based on a measurement of the channel 120 on the test fixture 116 with no communication device mounted on, or otherwise connected to, the test fixture 116, in an embodiment. In another embodiment, the one or more test fixture parameters 152 are obtained based measurement of a replica of the channel 120 on a replica of the test fixture 116.

In an embodiment, the PHY parameter reference module 146 is configured to mathematically embed the channel 120 into the reference model specified by the communication standard by mathematically combining or cascading one or more reference model values specified by the communication standard with the one or more test fixture parameters 152 characterizing the channel 120 to determine a reference channel. For example, the PHY parameter reference module 146 is configured to determine scattering parameters characterizing a reference channel by mathematically combining (e.g., by performing matrix multiplication) scattering parameters of the of a reference test package as defined by the communication standard with measured scattering parameters characterizing the channel 120, in an embodiment. The PHY parameter reference module 146 is further configured to determine the reference value of the PHY parameter based on the reference channel. For example, the PHY parameter reference module 146 is configured to determine the reference value of the PHY parameter by mathematically applying a nominal transmitter signal to an input of the reference channel to determine a reference PHY parameter value at an output of the reference channel, in an embodiment. The PHY compliance module 148 is configured to then determine compliance of the PHY parameter based on the reference value of the PHY parameter and a measured value of the PHY parameter, the measured value of the PHY parameter obtained from a measurement of the PHY parameter at the test point 118 on the test fixture 116 when the communication device 102 is mounted on, or otherwise connected to, the test fixture 116, in an embodiment.

Figure 2:
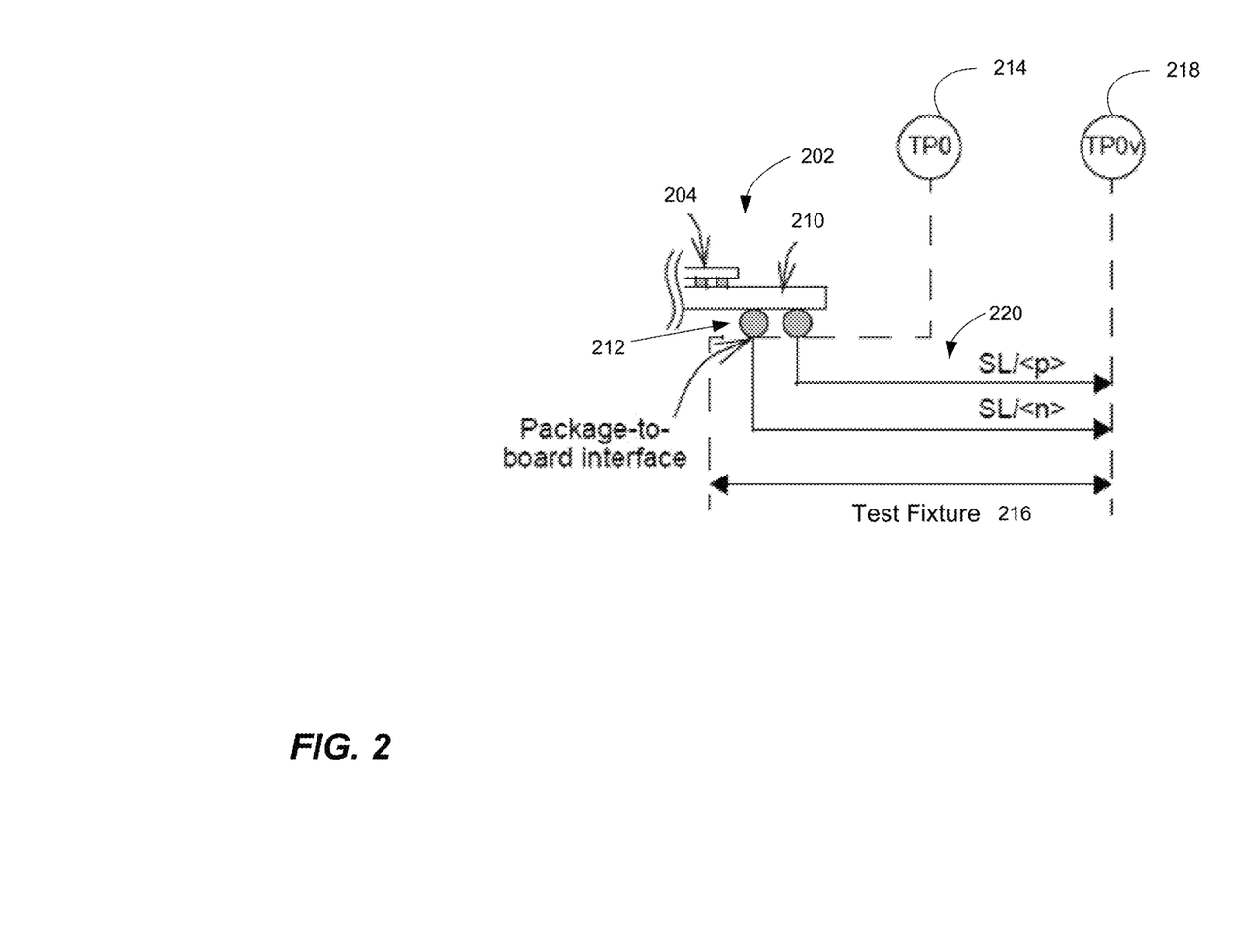
FIG. 2 is a diagram illustrating PHY parameter compliance determination for a communication device, according to an embodiment.

Although the test point 118 is generally described herein as being fanned out from the corresponding I/O output 112 on the test fixture 116, PHY parameter measurements described herein are performed at a test point located at a front panel of a host compliance board used to measure compliance of one or more PHY parameters of the communication device 102 at one or more I/O outputs 112 of the IC package 110 without an additional cable or trace on a test fixture, in some embodiments. In such embodiments, the reference channel corresponds to a channel connecting the corresponding I/O output 112 to the test point at the front panel of the host compliance board. For example, in an embodiment, the PHY parameter reference module 146 is configured to mathematically embed the channel on the host compliance board into a reference model specified by the communication standard by mathematically combining or cascading one or more reference model values specified by the communication standard with the one or more channel parameters characterizing the channel on the host compliance board to determine the reference channel. The one or more channel parameters characterizing the channel on the host compliance board are obtained based on a measurement of the channel on the host compliance board without the communication device 102 mounted on, or otherwise connected to, the host compliance board or are obtained based on a measurement of a corresponding replica channel on a replica host compliance board, in some embodiments. The PHY parameter reference module 146 is further configured to determine the reference value of the PHY parameter based on the reference channel corresponding to the channel on the host compliance board, in an embodiment. For example, the PHY parameter reference module 146 is configured to determine the reference value of the PHY parameter by mathematically applying a nominal transmitter signal to an input of the reference channel to determine a reference PHY value at an output of the reference channel corresponding to the channel on the host compliance board, in an embodiment. The PHY compliance module 148 is configured to then determine compliance of the PHY parameter based on the reference value of the PHY parameter and a measured value of the PHY parameter, the measured value of the PHY parameter obtained from a measurement of the PHY parameter at the test point on the host compliance board when the communication device 102 is mounted on, or otherwise connected to, the host compliance board, in an embodiment FIG. 2 is a diagram illustrating PHY parameter compliance determination for a communication device 202, according to an embodiment. The communication device 202 corresponds to the communication device 102 of FIG. 1, in an embodiment. For ease of explanation, PHY parameter compliance determination for the communication device 202 is described with reference to the measurement system 100 of FIG. 1. In other embodiments, PHY parameter compliance determination for the communication device 202 is performed using systems different from the measurement system 100 of FIG. 1. The communication device 202 includes an IC 204 that corresponds to the IC 104 in FIG. 1 mounted on an IC package 210 that corresponds to the IC package 110 of FIG. 1, in an embodiment. The IC package 210 comprises one or more I/O contacts 212 corresponding one or more the one or more contacts 112 in FIG. 1, in an embodiment. In an embodiment, a test fixture 216 is used to measure one or more PHY parameters of the communication device 202 for determining compliance of the PHY parameters of the communication device 202 with a communication standard. The test fixture 216 includes one or more test points TP0 214 corresponding to the one or more I/O contacts 212, in an embodiment. The one or more test points TP0 214 on the test fixture 216 are connected to one or more test points TP0v 218 on the test fixture 216 via respective one or more channels 220, in an embodiment.

Referring to FIGS. 1 and 2, in an embodiment, the compliance engine 144 determines compliance of PHY parameters of the communication device 202 at TP0 214 with a communication standard based on i) a value of the PHY parameter measured at the test point TP0 214 and ii) a reference value of the PHY parameter determined based on a) one or more model values specified by the communication standard, the one or more model values corresponding to I/O contact 212 mounted on, or otherwise connected to, the TP0 114 and b) one or more test fixture parameters characterizing the channel 220 that connects the test point TP0 114 to the test point TP0v 118, in the manner described above. In an embodiment, the reference model specified by the communication standard comprises one or more values for modeling a reference IC and IC package corresponding to the IC 204 and the IC package 210. In other embodiments, other suitable reference models are utilized.

Figure 3:
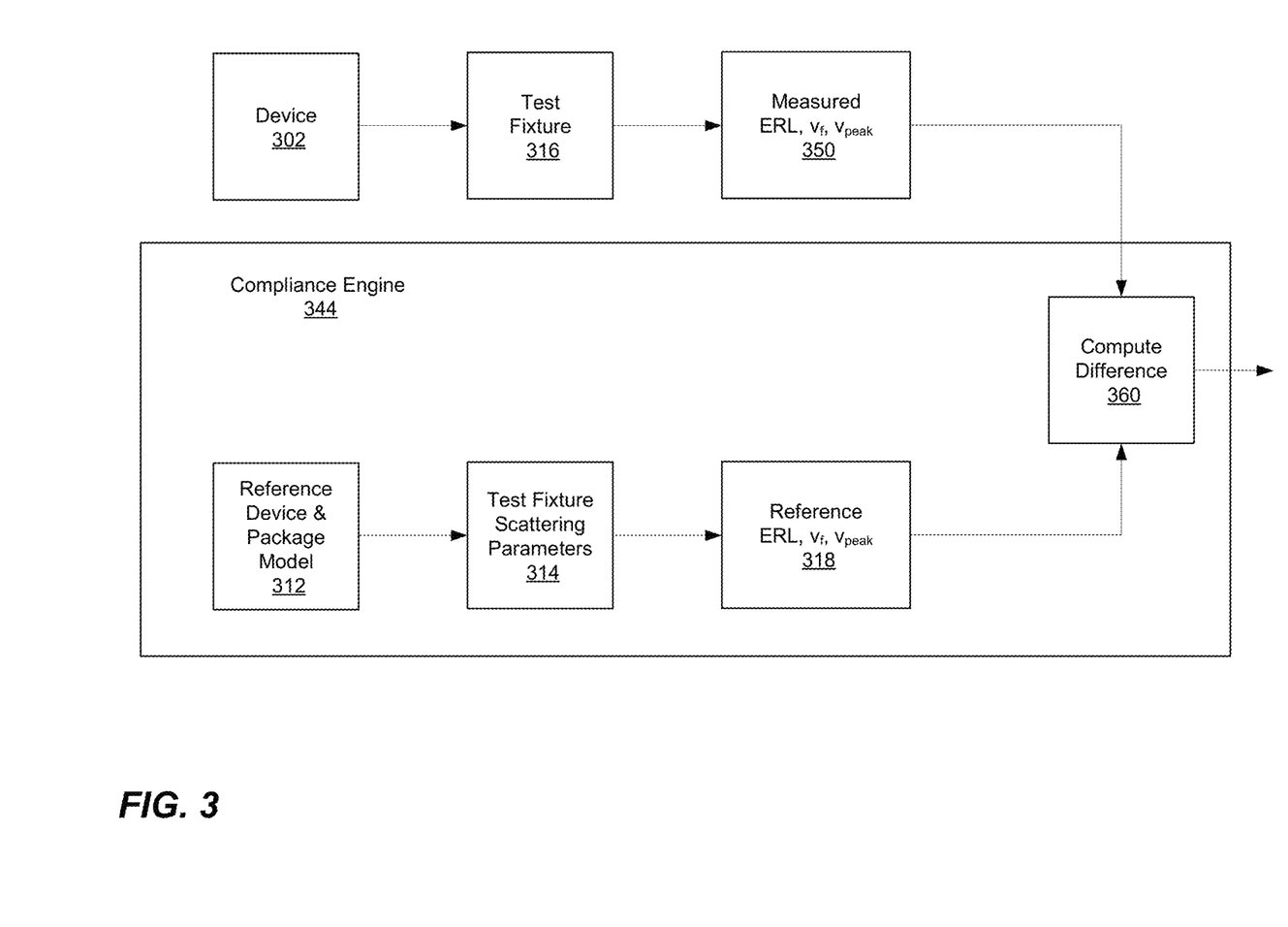
FIG. 3 is a block diagram of a PHY parameter measurement system, according to an embodiment.

FIG. 3 is a block diagram of a PHY parameter measurement system 300, according to an embodiment. The PHY parameter measurement system 300 includes a compliance engine 344 generally corresponding to the compliance engine 144 of FIG. 1, in an embodiment. The compliance engine 344 is configured to cascade a reference device and package model 312 with test fixture scattering parameters 314 to determine a reference channel, in an embodiment. The scattering parameters 314 characterize a channel on a test fixture 316, in an embodiment. The scattering parameters 314 are obtained by measurement of the channel on the test fixture 316 or by measurement of a replica channel on a replica of the test fixture 316, in various embodiments. In an embodiment, the compliance engine 314 is configured to determine scattering parameters corresponding to the test package model 312, wherein the test package model 312 incorporates one or more channel operating margin (COM) values specified by the communication standard. The compliance engine 344 is further configured to determine scattering parameters of the reference channel based on i) the test package scattering parameters corresponding to the test package model 312 and ii) the scattering parameters 314 of the channel on the test fixture.

With continued reference to FIG. 3, the compliance engine 344 is configured to determine reference values 318 of one or more PHY parameters based on the reference channel, in an embodiment. The reference values 318 of the one or more PHY parameters include one or more of i) a reference value of an effective return loss (ERL), ii) a reference value of a stead state voltage ($v_f$), and iii) a reference value of a peak voltage ($v_{peak}$), in an embodiment. In another embodiment, the reference values 318 of the one or more PHY parameters include one or more references values of one or more other suitable PHY parameters in addition to, or instead of, one or more of effective return loss, steady state voltage, and peak voltage. The compliance engine 344 is further configured to receive measured values 350 of one or more PHY parameters, in an embodiment. The measured values 350 of the one or more PHY parameters include one or more of i) a measured effective return loss (ERL), ii) a measured stead state voltage ($v_f$) and iii) a measured peak voltage ($v_{peak}$), in an embodiment. In another embodiment, the measured values 350 of the one or more PHY parameters include one or more measured values of one or more other suitable PHY parameters in addition to, or instead of, one or more of effective return loss, steady state voltage, and peak voltage. The measured values 350 of the one or more PHY parameters are obtained based on one or more measurements performed at a test point on the test fixture 316, the test point connected to a test point corresponding to an I/O contact of an IC package of the communication device 302 via the channel on the test fixture 316, in an embodiment.

Referring still to FIG. 3, the compliance engine 344 also includes computation module 360 configured to compute a difference between a measured value 50 of a PHY parameter and a reference value 318 of the PHY parameter, in an embodiment. The compliance engine 344 is configured to determine whether the PHY parameter is compliant with the communication standard based on a difference value (e.g., a minimum difference value, a maximum difference value, etc.) for the PHY parameter specified by the communication standard, in an embodiment. For example, the compliance engine 344 is configured to determine that the PHY parameter (e.g., ERL, $v_f$, $v_{peak}$, etc.) is compliant with the communication standard if the computed difference between the measured value 350 of the PHY parameter and the reference value 318 of the PHY parameter does not exceed a maximum difference value specified for the PHY parameter by the communication standard, or, alternatively, exceeds a minimum difference value specified for the PHY parameter by the communication standard, in an embodiment. In another embodiment the compliance engine 344 is configured to determine that the PHY parameter (e.g., ERL, $v_f$, $v_{peak}$, etc.) is compliant with the communication standard if the measured value 350 of the PHY parameter exceeds, or, alternatively does not exceed, the computed reference value of the PHY parameter.

Figure 4:
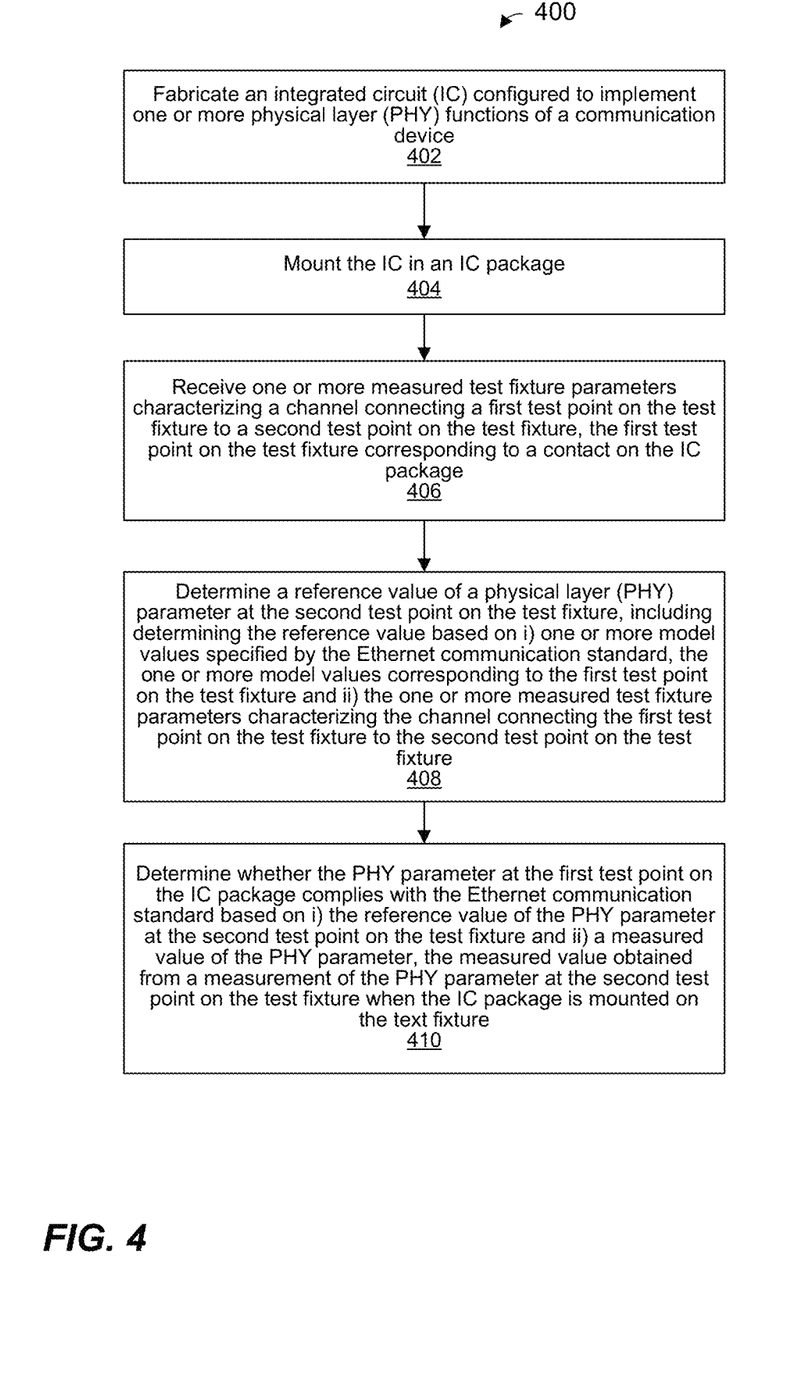
FIG. 4 is a flow diagram of a method 400 for manufacturing an IC that is compliant with an Ethernet communication standard, according to an embodiment.

FIG. 4 is a flow diagram of a method 400 for manufacturing an IC that is compliant with an Ethernet communication standard, according to an embodiment. The method 400 is implemented in the measurement system 100 of FIG. 1, in an embodiment. For example, at least a portion of the method 400 is implemented by the compliance engine 144 of FIG. 1, in an embodiment. In other embodiments, method 400 is implemented by another suitable component of the system 100 of FIG. 1 or is implemented in a suitable measurement system different from the measurement system 100 of FIG. 1.

At block 402, an IC is fabricated. In an embodiment, the IC is configured to implement one or more physical layer (PHY) functions of the communication device. In an embodiment, the IC 104 of FIG. 1 is fabricated. In another embodiment, an IC different from the IC 104 of FIG. 1 is fabricated. At block 404, the IC fabricated at block 402 is mounted into an IC package. In an embodiment, the IC is mounted into the IC package 110 of FIG. 1. In another embodiment, the IC is mounted into an IC package different from the IC package 110 of FIG. 1.

At block 406, one or more measured test fixture parameters characterizing a channel on a test fixture are received at a processor. The channel on the test fixture connects a first test point on the test fixture, the first test point corresponding to a contact on the IC package, to a second test point on the test fixture, in an embodiment.

At block 408, a reference value of a PHY parameter at the second test point on the test fixture is determined. In an embodiment, the reference value of the PHY parameter is determined based on i) one or more model values specified by the Ethernet communication standard, the one or more model values corresponding to the first test point on the test fixture and ii) the one or more measured test fixture parameters characterizing the channel connecting the first test point on the test fixture to the second test point on the test fixture.

At block 410, it is determined whether the PHY parameter at the first test point on the IC package complies with the Ethernet communication standard based on i) the reference value of the PHY parameter at the second test point on the test fixture and ii) a measured value of the PHY parameter, the measured value obtained from a measurement of the PHY parameter at the second test point when the IC package is mounted on the test fixture.

In some embodiments, the method 400 omits blocks 402 and 404. In such embodiments, blocks 406-410 are performed for determining compliance of a previous fabricated IC that is mounted into an IC package. In an embodiment, blocks 406-410 are performed by one or more processors, such the processor 140 of FIG. 1. In an embodiment, blocks 406-410 are performed by the compliance engine 144 of FIG. 1 or the compliance engine 344 of FIG. 3. In other embodiments, at least some of the blocks 406-410 are performed by suitable other suitable components of a compliance measurement system.

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored in any suitable computer readable memory such as a random access memory (RAM), a read only memory (ROM), a flash memory, etc. The software or firmware instructions may include machine readable instructions that, when executed by one or more processors, cause the one or more processors to perform various acts (e.g., including performing mathematical calculations, etc.).

When implemented in hardware, the hardware may comprise one or more of discrete components, an integrated circuit, an application-specific integrated circuit (ASIC), a programmable logic device (PLD), etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A method for manufacturing a communication device that is compliant with an Ethernet communication standard, the method comprising:
    fabricating an integrated circuit (IC) configured to implement one or more physical layer (PHY) functions of the communication device;
    mounting the IC in an IC package;
    receiving, at one or more processors of a measurement system, one or more measured test fixture parameters characterizing a channel connecting a first test point on a test fixture to a second test point on the test fixture, the first test point on the test fixture corresponding to a contact on the IC package, the one or more measured test fixture parameters characterizing the channel in isolation from the IC package;
    determining, by the one or more processors of the measurement system, a reference value of a physical layer (PHY) parameter at the second test point on the test fixture, including determining the reference value based on
        i) one or more model values specified by the Ethernet communication standard, the one or more model values corresponding to the first test point on the test fixture, and
        ii) the one or more measured test fixture parameters characterizing the channel connecting the first test point on the test fixture to the second test point on the test fixture in isolation from the IC package; and
    determining, by the one or more processors of the measurement system, whether the PHY parameter at the first test point on the IC package complies with the Ethernet communication standard based on i) the reference value of the PHY parameter at the second test point on the test fixture, and ii) a measured value of the PHY parameter, the measured value obtained from a measurement of the PHY parameter at the second test point on the test fixture when the IC package is mounted on the test fixture.

2. The method of claim 1, further comprising receiving, at the one or more processors of the measurement system, the measured value of the PHY parameter obtained from the measurement of the PHY parameter at the second test point on the test fixture.

3. The method of claim 1, wherein:
    determining the reference value for the PHY parameter at the second test point on the test fixture comprises determining a reference values for a transmit PHY parameter at the second test point on the test fixture; and
    determining whether the PHY parameter at the first test point on the IC package complies with the Ethernet communication standard comprises determining whether the transmit PHY parameter at the first test point on the IC package complies with the Ethernet communication standard based on i) the reference value of the transmit PHY parameter at the second test point on the test fixture and ii) a measured value of the transmit PHY parameter of the IC, the measured value obtained from a measurement of the transmit PHY parameter performed at the second test point on the test fixture when the IC package is mounted on the test fixture.

4. The method of claim 3, wherein determining the reference value for the transmit PHY parameter at the second test point on the test fixture comprises determining one of i) a reference value for an effective return loss at the second test point on the test fixture, ii) a reference value for a linear pulse peak voltage at the second test point on the test fixture, and iii) a reference value for a steady state voltage at the second test point on the test fixture.

5. The method of claim 1, wherein receiving the one or more measured test fixture parameters characterizing the channel on the test fixture comprises receiving measured scattering parameters (S-parameters) of the channel on the test fixture that characterize the channel in isolation from the IC package; and wherein determining the reference value of the PHY parameter at the second test point on the test fixture includes determining the reference value based on i) the one or more model values corresponding to the first test point, and ii) the measure S-parameters that characterize the channel connecting the first test point to the second test point in isolation from the IC package.

6. The method of claim 5, wherein determining the reference value for the physical layer (PHY) parameter at the second test point on the test fixture includes
determining test package scattering parameters corresponding to a test package model, wherein the test package model incorporates one or more channel operating margin (COM) values specified by the Ethernet communication standard,
determining, based on i) the test package scattering parameters and ii) the scattering parameters of the channel on the test fixture that characterize the channel connecting the first test point to the second test point in isolation from the IC package, scattering parameters of a reference channel that combines the test package scattering parameters and the scattering parameters of the channel on the test fixture, and
determining the reference value based on the scattering parameters of the reference channel.

7. The method of claim 1, wherein receiving the one or more measured test fixture parameters characterizing the channel on the test fixture comprises receiving one or more measured test fixture parameters obtained based on a measurement of the channel on the test fixture.

8. The method of claim 1, wherein receiving the one or more measured test fixture parameters characterizing the channel on the test fixture comprises receiving one or more measured test fixture parameters obtained based on a measurement of a corresponding channel on a replica of the test fixture.

9. The method of claim 1, wherein:
receiving the one or more measured test fixture parameters characterizing a channel on the test fixture comprises receiving the one or more measured channel characteristics at a processor of an oscilloscope, and
determining the reference value for the PHY parameter at the second test point on the test fixture comprises determining the reference value by the processor of the oscilloscope.

10. A measurement system for determining compliance of an integrated circuit (IC) mounted in an IC package, the system comprising:
a test fixture comprising a channel connecting a first test point on the test fixture to a second test point on the test fixture, the first test point on the test fixture corresponding to a contact on the IC package;
one or more processors; and
a memory storing computer-readable instructions that, when executed by the one or more processors, cause the one or more processors to:
receive one or more measured test fixture parameters characterizing the channel on the test in isolation from the IC package,
determine a reference value of a physical layer (PHY) parameter at the second test point on the test fixture, including determining the reference value based on i) one or more model values specified by the Ethernet communication standard, the one or more model values corresponding to the first test point on the test fixture, and
ii) the one or more measured test fixture parameters characterizing the channel connecting the first test point on the test fixture to the second test point on the test fixture in isolation from the IC package, and
determine whether the PHY parameter of the IC complies with the Ethernet communication standard based on i) the reference value of the PHY parameter at the second test point on the test fixture and ii) a measured value of the PHY parameter of the IC, the measured value obtained from a measurement of the PHY parameter performed at the second test point on the test fixture when the IC package is mounted on the test fixture.

11. The measurement system of claim 10, wherein the memory further stores computer-readable instructions that, when executed by the one or more processors, cause the one or more processors to receive the measured value of the PHY parameter obtained from the measurement of the PHY parameter at the second test point on the test fixture.

12. The measurement system of claim 10, wherein the computer-readable instructions, when executed by the one or more processors, cause the one or more processors to:
determine the reference value for a transmit PHY parameter at the second test point on the test fixture; and
determine whether the transmit PHY parameter at the first test point on the IC package complies with the Ethernet communication standard based on
i) the reference value of the transmit PHY parameter at the second test point on the test fixture, and
ii) a measured value of the transmit PHY parameter, the measured value obtained from a measurement of the transmit PHY parameter performed at the second test point on the test fixture when the IC package is mounted on the test fixture.

13. The measurement system of claim 12, wherein the computer-readable instructions, when executed by the one or more processors, cause the one or more processors to determine the reference value for the transmit PHY parameter at least by determining one of i) a reference value for an effective return loss at the second test point on the test fixture, ii) a reference value for a linear pulse peak voltage at the second test point on the test fixture, and iii) a reference value for a steady state voltage at the second test point on the test fixture.

14. The measurement system of claim 10, wherein the computer-readable instructions, when executed by the one or more processors, cause the one or more processors to:
receive measured scattering parameters (S-parameters) of the channel on the test fixture that characterize the channel connecting the first test point to the second test point in isolation from the IC package; and
determine the reference value based on i) the one or more model values corresponding to the first test point, and ii) the measure S-parameters that characterize the channel connecting the first test point to the second test point in isolation from the IC package.

15. The measurement system of claim 14, wherein the computer-readable instructions, when executed by the one or more processors, cause the one or more processors to:
determine test package scattering parameters corresponding to a test package model, wherein the test package model incorporates one or more channel operating margin (COM) values specified by the Ethernet communication standard, and
determine, based on i) the test package scattering parameters and ii) the measured scattering parameters of the channel on the test fixture that characterize the channel connecting the first test point to the second test point in isolation from the IC package, scattering parameters of a reference channel that combines the test package scattering parameters and the scattering parameters of the channel on the test fixture, and determine the reference value for the PHY parameter based on the scattering parameters of the reference channel.

16. The measurement system of claim 10, wherein the one or more processors and the memory are included with an oscilloscope configured to:

measure the one or more parameters of the channel on the test fixture, and measure the PHY parameter of the IC at the second test point on the test fixture.

17. The measurement system of claim 10, wherein the channel on the test fixture is configured, in accordance with test fixture specification in the Ethernet communication standard, to have an insertion loss in a range of insertion losses, the range being at least 4 dB.

18. A non-transitory computer-readable medium, or media, storing instructions that, when executed by one or more processors, cause the one or more processors to:

receive one or more measured test fixture parameters characterizing a channel connecting a first test point on the test fixture to a second test point on a test fixture, the first test point on the test fixture corresponding to a contact on an integrated circuit IC package, the one or more measured test fixture parameters characterizing the channel in isolation from the IC package;

determine a reference value for a physical layer (PHY) parameter of an IC mounted in the IC package, the reference value corresponding to the second test point on the test fixture, including determining the reference value based on i) one or more model values specified by the Ethernet communication standard, the one or more model values corresponding to the first test point on the test fixture, and ii) the one or more measured test fixture parameters characterizing the channel connecting the first test point on the test fixture to the second test point on the test fixture in isolation from the IC package; and determine whether the PHY parameter of the IC complies with the Ethernet communication standard based on i) the reference value of the PHY parameter at the second test point on the test fixture, and ii) a measured value of the PHY parameter of the IC, the measured value obtained from a measurement of the PHY parameter performed at the second test point on the test fixture when the IC package is mounted on the test fixture.

19. The non-transitory computer-readable medium, or media, of claim 18, further storing instructions that, when executed by the one or more processors, cause the one or more processors to:

determine the reference value for a transmit PHY parameter at the second test point on the test fixture; and determine whether the transmit PHY parameter at the first test point on the IC package complies with the Ethernet communication standard based on i) the reference value of the transmit PHY parameter at the second test point on the test fixture, and ii) a measured value of the transmit PHY parameter, the measured value obtained from a measurement of the transmit PHY parameter performed at the second test point on the test fixture when the IC package is mounted on the test fixture.

20. The non-transitory computer-readable medium, or media, of claim 18, wherein the instructions cause the one or more processor to determine the reference value for the transmit PHY parameter at least by determining one of i) a reference value for an effective return loss at the second test point on the test fixture, ii) a reference value for a linear pulse peak voltage at the second test point on the test fixture, and iii) a reference value for a steady state voltage at the second test point on the test fixture.

21. The non-transitory computer-readable medium, or media, of claim 18, further storing instructions that, when executed by the one or more processors, cause the one or more processors to:

receive measured scattering parameters (S-parameters) of the channel on the test fixture that characterize the channel in isolation from the IC package; and determine the reference value based on i) the one or more model values corresponding to the first test point, and ii) the measured S-parameters that characterize the channel connecting the first test point to the second test point in isolation from the IC package.

22. The non-transitory computer-readable medium, or media, of claim 21, further storing instructions that, when executed by the one or more processors, cause the one or more processors to determining the reference value at least by:

determining test package scattering parameters corresponding to a test package model, wherein the test package model incorporates one or more channel operating margin (COM) values specified by the Ethernet communication standard;

determining, based on i) the test package scattering parameters and ii) the scattering parameters of the channel on the test fixture that characterize the channel connecting the first test point to the second test point in isolation from the IC package, scattering parameters of a reference channel that combines the test package scattering parameters and the scattering parameters of the channel on the test fixture; and determining the reference value based on the scattering parameters of the reference channel.

* * * * *